United States Patent
Zhu

(10) Patent No.: US 7,583,556 B2
(45) Date of Patent: Sep. 1, 2009

(54) SWITCHING CIRCUIT FOR CMOS CIRCUIT

(75) Inventor: Jia-Chang Zhu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 182 days.

(21) Appl. No.: 11/738,529

(22) Filed: Apr. 23, 2007

(65) Prior Publication Data

US 2008/0150612 A1  Jun. 26, 2008

(30) Foreign Application Priority Data

Dec. 22, 2006  (CN)  .................... 2006 2 0016701 U

(51) Int. Cl.
*G11C 5/14* (2006.01)
(52) U.S. Cl. .................. 365/226; 365/227; 327/196
(58) Field of Classification Search ............. 365/185.1, 365/226, 227, 228; 713/1; 327/196
See application file for complete search history.

(56) References Cited

U.S. PATENT DOCUMENTS

| | | | | |
|---|---|---|---|---|
| 5,729,062 A * | 3/1998 | Satoh | ......................... | 307/130 |
| 6,253,319 B1 * | 6/2001 | Tran et al. | ...................... | 713/1 |
| 6,266,786 B1 * | 7/2001 | Chang | ......................... | 714/22 |
| 6,329,866 B1 * | 12/2001 | Watarai | ...................... | 327/379 |
| 6,911,746 B2 * | 6/2005 | Orr et al. | ..................... | 307/107 |
| 2008/0159562 A1 * | 7/2008 | Liu et al. | ................... | 381/94.5 |
| 2008/0222408 A1 * | 9/2008 | Li | ................. | 713/2 |
| 2008/0229087 A1 * | 9/2008 | Li | ................. | 713/1 |

* cited by examiner

*Primary Examiner*—Tuan T Nguyen
*Assistant Examiner*—Hien N Nguyen
(74) *Attorney, Agent, or Firm*—Frank R. Niranjan

(57) ABSTRACT

A controlling circuit for controlling on-off switching of a power supply for a CMOS circuit includes a CMOS circuit (20) and a switch (30). The CMOS circuit includes a first circuit (50) for storing the system time of the computer and a second circuit (70) for storing other system settings of the computer. One terminal of the switch is connected to the first circuit and a power supply (10) in parallel via a resistor (R2). The one terminal of the switch is connected to the second circuit, and another terminal of the switch is connected to ground. When the one terminal of the switch is connected to the another terminal, the data stored in the second circuit is cleared while the system time stored in the first circuit remains.

8 Claims, 2 Drawing Sheets

FIG. 1 <PRIOR ART>

SWITCHING CIRCUIT FOR CMOS CIRCUIT

BACKGROUND OF THE INVENTION

1. Field of the Invention

The present invention relates to switching circuits for controlling on-off switching of a power supply, and more particularly to a switching circuit for controlling on-off switching of a power supply for a CMOS (Complementary Metal Oxide Semiconductor) circuit.

2. Description of Related Art

Referring to FIG. 1, a typical switching circuit for a CMOS circuit includes a CMOS circuit 20', a first resistor R1', a second resistor R2', a first capacitor C1', a second capacitor C2', a third capacitor C3', and a switch 30'. The CMOS circuit 20' includes a first circuit 50' for storing the system time of a computer and a second circuit 70' for storing other system settings of the computer. The switch 30' includes three terminals 1, 2, and 3. An output terminal of a power supply 10' is connected to the terminal 2 of the switch 30' via the first resistor R1'. The terminal 3 of the switch 30' is connected to ground. The terminal 2 of the switch 30' is connected to ground via the first capacitor C1'. The terminal 2 is connected to a power input of the first circuit 50'. The power input of the first circuit 50' is connected to ground via the second capacitor C2'. The terminal 2 is connected to a power input of the second circuit 70' via the second resistor R2'. The power input of the second circuit 70' is connected to ground via the third capacitor C3'. Generally, the switch 30' is switched off and the CMOS circuit 20' is powered on and used for storing the system time as well as system settings of the computer.

However, when the data stored in the CMOS circuit 20' needs to be cleared, the terminal 2 of the switch 30' is connected to the terminal 3, the switch 30' is switched on. At this moment, both of the first circuit 50' and the second circuit 70' are grounded, so the data stored in CMOS circuit is cleared, as well as the system time.

Usually, when users reset the data stored in the CMOS circuit, they just need to set new system settings and do not need to reset the system time.

What is needed, therefore, is to provide a switching circuit for controlling on-off switching of a power supply for a CMOS circuit, that can keep the system time stored in the CMOS circuit when the switch is switched on.

SUMMARY OF THE INVENTION

A controlling circuit for controlling on-off switching of a power supply for a CMOS circuit comprises a CMOS circuit and a switch. The CMOS circuit includes a first circuit for storing the system time of the computer and a second circuit for storing other system settings of the computer. The first circuit and a power supply are connected in parallel to a terminal of the switch via a resistor. The second circuit is also connected to the same terminal, and another terminal of the switch is connected to ground.

Other advantages and novel features of the present invention will become more apparent from the following detailed description of preferred embodiment when taken in conjunction with the accompanying drawings, in which:

DETAILED DESCRIPTION OF THE INVENTION

Figure 1:
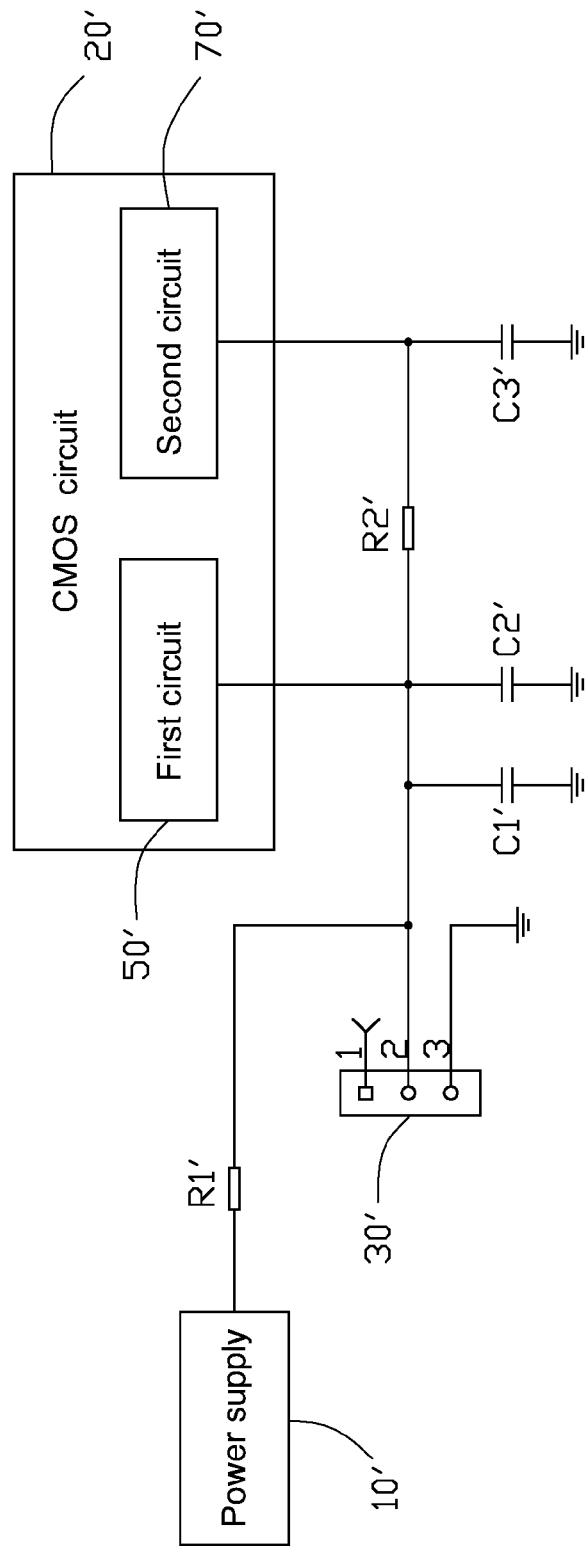
FIG. 1 is a diagram of a typical switching circuit for controlling on-off switching of a power supply for a CMOS circuit.
Figure 2:
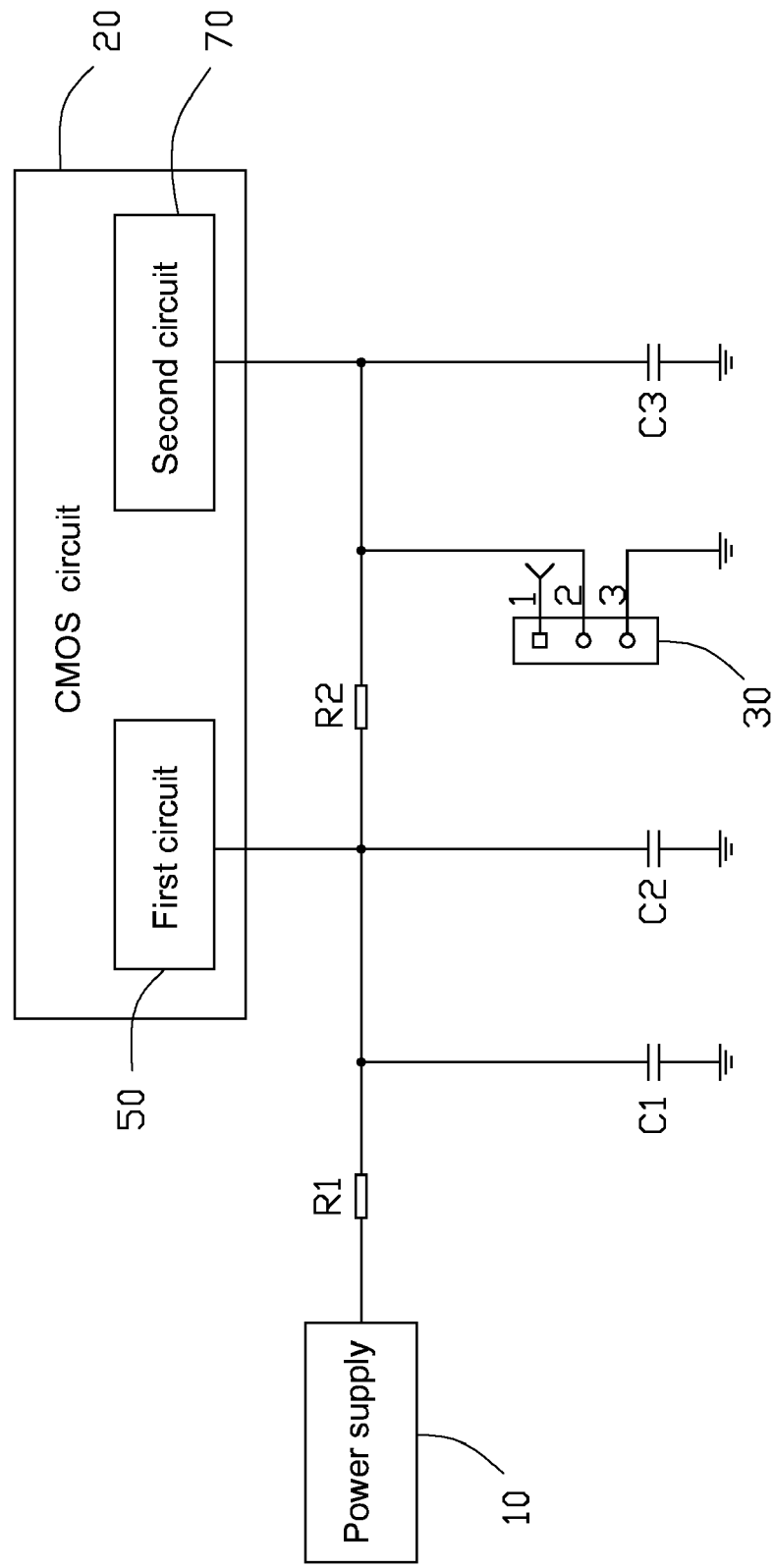
FIG. 2 is a diagram of a switching circuit for controlling on-off switching of a power supply for a CMOS circuit in accordance with a preferred embodiment of the present invention.

Referring to FIG. 2, a switching circuit for controlling on-off switching of a power supply for a CMOS circuit in accordance with a preferred embodiment of the present invention includes a CMOS circuit 20, a first resistor R1, a second resistor R2, a switch 30, a first capacitor C1, a second capacitor C2, and a third capacitor C3. The CMOS circuit 20 comprises a first circuit 50 and a second circuit 70. The first circuit 50 is used for storing the system time of a computer and the second circuit 70 is used for storing other system settings of the computer. The switch 30 includes three terminals 1, 2, and 3.

First ends of the first capacitor C1 and the second capacitor C2 are connected in parallel to an output of the power supply 10 via the first resistor R1. Second ends of the first capacitor C1 and the second capacitor C2 are connected to ground. The output of the power supply 10 is connected to a power input of the first circuit 50 via the first resistor R1. The power input of the first circuit 50 is connected to ground via the second capacitor C2. The output of the power supply 10 is connected to the terminal 2 of the switch 30 via the first resistor R1 and the second resistor R2. The terminal 3 of the switch 30 is connected to ground. The terminal 2 of the switch 30 is connected to a power input of the second circuit 70. The power input of the second circuit 70 is connected to ground via the third capacitor C3.

Generally, the switch 30 is switched off. An output voltage of the power supply 10 is applied to the power input of the first circuit 50 via the first resistor R1 and applied to the power input of the second circuit 70 via the first and second resistors R1, R2. The CMOS circuit 20 is used for storing the system time as well as other system configuration details of the computer.

When the data stored in the CMOS circuit 20 needs to be cleared, the terminal 2 of the switch 30 is connected to the terminal 3, the switch 30 is switched on. At this time, the power input of the second circuit 70 is to ground while the power input of the first circuit 50 is at a high level because of the second resistor R2 connected between the switch 30 and the power input of the first circuit 50. So, the data stored in CMOS circuit 20 is cleared but not the system time stored in the first circuit 50.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A controlling circuit for controlling on-off switching of a power supply for a CMOS circuit, comprising:
   a CMOS circuit including a first circuit for storing system time of a computer and a second circuit for storing other system settings of the computer, the first circuit and the second circuit connected to the power supply; and
   a switch including one terminal connected to a node between the first circuit and the power supply via a resistor, the terminal being connected to the second circuit, and another terminal of the switch being connected directly to ground.

2. The controlling circuit as described in claim 1, wherein the first circuit is connected to ground via a capacitor.

3. The controlling circuit as described in claim 1, wherein the second circuit is connected to ground via a capacitor.

4. The controlling circuit as described in claim 1, wherein the first circuit is connected to the power supply via another resistor.

5. A controlling circuit for controlling on-off switching of a power supply for a CMOS circuit, comprising:
   a CMOS circuit including a first circuit configured for storing system time of a computer and a second circuit configured for storing other system settings of the computer, each at the first and second circuits having a power input connected to the power supply; and
   a switch including one terminal connected to the power input of the first circuit via a first resistor and connected to the power input of the second circuit directly, another terminal of the switch being connected directly to ground, wherein
   when the one terminal of the switch is connected to the another terminal, the power input of the second circuit is grounded while the power input of the first circuit is still at a high level, whereby said other system settings stored in the second circuit is cleared while the system time stored in the first circuit remains.

6. The controlling circuit as described in claim 5, wherein the power input of the first circuit is connected to ground via a pair of capacitors in parallel.

7. The controlling circuit as described in claim 5, wherein the power input of the second circuit is connected to ground via a capacitor.

8. The controlling circuit as described in claim 5, wherein the power supply is connected to the power input of the first circuit via a second resistor and connected to the power input of the second circuit via the second resistor and the first resistor in series.

* * * * *